United States Patent
Funaba et al.

(10) Patent No.: US 6,970,369 B2
(45) Date of Patent: Nov. 29, 2005

(54) MEMORY DEVICE

(75) Inventors: Seiji Funaba, Tokyo (JP); Yoji Nishio, Tokyo (JP)

(73) Assignee: Elpida Memory, Inc. (JP)

( * ) Notice: Subject to any disclaimer, the term of this patent is extended or adjusted under 35 U.S.C. 154(b) by 195 days.

(21) Appl. No.: 10/234,261

(22) Filed: Sep. 4, 2002

(65) Prior Publication Data

US 2003/0043683 A1 Mar. 6, 2003

(30) Foreign Application Priority Data

Sep. 6, 2001 (JP) ........................................ 2001-270518

(51) Int. Cl.$^7$ ............................................. D11C 5/06
(52) U.S. Cl. ..................... 365/63; 365/230.03; 365/233
(58) Field of Search .............................. 365/63, 230.03, 365/233

(56) References Cited

U.S. PATENT DOCUMENTS

| | | | | |
|---|---|---|---|---|
| 6,125,419 A | * | 9/2000 | Umemura et al. | 710/110 |
| 6,308,232 B1 | * | 10/2001 | Gasbarro | 710/100 |
| 6,370,053 B2 | * | 4/2002 | Chang et al. | 365/51 |
| 6,538,951 B1 | * | 3/2003 | Janzen et al. | 365/230.03 |
| 6,690,612 B2 | * | 2/2004 | Gall et al. | 365/226 |

FOREIGN PATENT DOCUMENTS

| | | | |
|---|---|---|---|
| JP | 4-50933 | 4/1992 | ....... H03K/10/0175 |
| JP | 07-135513 | 5/1995 | ........... H04L/25/02 |
| JP | 07-182078 | 7/1995 | ............. G06F/3/00 |
| JP | 07-240680 | 9/1995 | ....... H03K/19/0175 |
| JP | 11-083545 | 3/1999 | ............. G06F/3/00 |
| JP | 11-317489 | 11/1999 | ........... H01L/25/00 |
| JP | 11-353228 | 12/1999 | ........... G06F/12/06 |
| JP | 2001-257018 | 9/2001 | ........... H01R/12/16 |
| JP | 2002-032164 | 1/2002 | ............. G06F/3/00 |
| JP | 2002-271108 | 9/2002 | ............. H01P/1/212 |
| JP | 2003-068082 | 3/2003 | ........... G11C/11/409 |

* cited by examiner

Primary Examiner—Son T. Dinh
(74) Attorney, Agent, or Firm—Hayes Soloway P.C.

(57) ABSTRACT

In a memory device having a controller and multiple memory modules both of which are mounted together on a motherboard, a high-speed operation is executed by suppressing waveform distortion caused by signal reflection. Since signal reflection occurs when a controller performs the writing/reading of data relative to memory units on memory modules, active terminator units are included in the controller and the memory units. These active terminator units are provided for a data bus and/or a clock bus in order to terminate these buses in memory units. The active terminator units provided for the controller and the memory units may be put into an inactive state when data is to be received.

47 Claims, 9 Drawing Sheets

MEMORY DEVICE

BACKGROUND OF THE INVENTION

The present invention relates to a memory device, and relates in particular to a memory device having a circuit configuration that ensures an increase in the operating speed.

While memory devices have been highly integrated, interfaces have been developed that permit the memory devices to be operated at high speeds and with a low signal amplitude. To this end, SSTL (Stub Series Termination Logic) has been proposed as the standards for these interfaces. In order to increase the operating speeds of DRAM, which is one type of memory devices, a DDR (Double Data Rate) method has been also proposed. In the DDR method, the data rate can be doubled by inputting and outputting data in synchronism with the leading edge and the trailing edge of each clock.

These types of memory devices have a configuration wherein multiple memory modules are mounted on a motherboard in parallel and at predetermined distances or intervals. According to this configuration, when the memory modules are mounted on a motherboard, electrical contacts are established between the modules and their respective connectors. For this, the motherboard is provided with a slot for attachment of each memory module, and a plurality of terminals are arranged in each of the slots to make electrical connections to the corresponding memory modules. In addition, buffers, such as multiple memory units and registers, are mounted on the obverse and/or reverse faces of the memory modules, and are contacted with the connectors through the terminals formed at ends of the memory modules.

Among the memory devices, there is one where a controller called a chip set is mounted on the motherboard to control the memory units of the memory modules. According to this memory device, a data bus, a command bus and a clock bus (in the following explanation, these buses may be collectively referred to simply as buses) are wired on the motherboard. These buses provide electrical connections between the controller and the memory units and between the controller and the registers on the individual memory modules.

In an example configuration, the data and the clock buses among the above described buses are extended from the controller directly to the memory units of the memory modules while the command bus is extended to the registers through the connectors and is connected through the registers to the memory units of the memory modules.

Furthermore, a memory device conforming to the SSTL standards employs a configuration such that DRAMs (which serve as the memory units of the memory modules) and the connectors are connected through stubs.

In the above-mentioned memory device, it has been considered that the frequency of the clock provided for the clock bus is taken into account and is set equal to or higher than 100 MHz (e.g., 133 MHz). Therefore, by employing DDR, a data reading/writing rate can be attained that is equal to or higher than 200 MHz. Recent requests, however, have been made for memory modules that operate at clock frequencies of from 200 to 300 MHz, in which case data rates would rise to 400 to 600 MHz or more.

To respond to these requests, a stub structure and a wiring structure for a memory module have been proposed that would reduce signal reflection or signal distortion due to impedance mismatching (Japanese Unexamined Patent Publication No. 2001-257018A). However, according to a study performed by the present inventors, it was found that there are various factors that would prevent the operation at high speed of these types of memory device, and it was further found that neither improvements in the stub structure nor improvements in the memory module structure would provide a satisfactory operating speed increase.

For example, the following shortcoming was found as regards the data bus. When a readout operation is carried out through the data bus from the controller mounted on the motherboard to the memory unit of each memory module, the controller is put in a state that is not terminated. Accordingly, signal reflection occurs in the controller. Further, when a write-in operation is performed by the controller, it was also found out that signal reflection occurs at the connector, depending on the length of the data bus from the controller to the connector. Signal reflection was also observed when DRAMs were connected as the memory units for the memory modules and when data writing was performed for individual DRAMs.

Furthermore, the data bus has one end of the data connected to the controller and the other end connected to a non-reflecting terminating set, and a predetermined terminal potential is applied to the non-reflecting terminator from a terminal power source. This configuration is, however, disadvantageous in that the power sources increases in number. This is also applicable to the command address bus.

As for the clock bus, a memory device has been proposed wherein a pair of complementary clocks are supplied to the individual memory units of the memory module in order to accurately perform the clock operation. In this memory device, a controller and each of the memory units are connected through a pair of clock buses. No consideration has been given for the signal reflection that occurs in the memory units in this configuration.

SUMMARY OF THE INVENTION

It is, therefore, one objective of the present invention to provide a memory device which is capable of decreasing reflection occurring between a controller and a data bus (command address bus), so that data can be read from memory units at a high speed.

It is another objective of the present invention to provide a memory device wherein reflection of a signal along a clock bus can be decreased, so that a fast and accurate operation can be performed.

According to one aspect of the present invention, a memory device comprises:

multiple memory units electrically connected to a bus; and a controller, connected to one end of the bus, for controlling a reading operation and a writing operation relative to the memory units, wherein an active terminating circuit that is rendered active only during the reading operation is provided for the controller. In the memory device, the memory units are connected to the bus by respective stubs and connectors. Further, it is preferable that reflection prevention means, for preventing a reflected wave during the reading operation performed for the multiple memory units, be provided between the controller and the nearest connector, which is one of the connectors that connect the multiple memory units to the bus and that is located nearest the controller. The reflection prevention means may be a circuit wherein the characteristic impedance existing between the nearest connector and the controller is less than another characteristic impedance for a memory module, and/or, the reflection prevention means may include a capacitor connected to the nearest connector and the controller.

Further, according to the memory device of the present invention, while one end of the bus is connected to the controller, a terminating set is connected to the other, opposite end, and consists of a pair of terminal resistors that are connected in series between a predetermined power terminal and a reference power terminal. And the other, opposite end of the bus is connected to a connection joint used in common by the terminal resistors. In this case, the bus may be either a data bus or a command bus. Further, it is preferable that the memory units be terminated by an active terminator unit, and that the bus be shielded. The memory units are, for example, DRAMs.

According to another aspect of the invention, a memory device comprises:

a clock controller for transmitting complementary clocks;

a pair of clock buses, connected at the ends thereof to the clock controller to transmit the complementary clocks; and multiple memory units, electrically connected to the pair of clock buses, wherein a terminal resistor is connected to the ends of the pair of clock buses on the opposite side of the clock controller, and along with the terminal resistor, the pair of clock buses are terminated by differential coupling.

The memory units are connected through a pair of connectors to the pair of clock buses, and a clock bus interval between the terminal resistor and the pair of connectors that are nearest the terminal resistor has a satisfactory length so as to serve substantially as a distributed constant circuit. The impedance for the clock bus interval having the length can be defined substantially as the characteristic impedance for the distributed constant circuit.

According to the present invention, the memory device further comprises:

a data bus for connecting the multiple memory units through multiple connectors; and a data bus controller, connected to one end of the data bus, for exchanging data with the memory units across the data bus. In this case, the data bus controller has an active terminator unit that is rendered active when data is to be read from the memory units, and that is maintained inactive when data is to be written to the memory units. A terminal resistor, which is constituted by a pair of resistors connected in series, is connected to the end of the data bus on the opposite side of the data bus controller. The data bus is connected to a connection joint common to the pair of registers, and the other end of the data bus is terminated by differential coupling.

According to an additional aspect of the invention, a memory device comprises:

multiple memory units electrically connected to a data bus; and a data bus controller, electrically connected to one end of the data bus, for controlling a reading operation and a writing operation relative to the multiple memory units, wherein the data bus controller includes an active terminator unit and a controller for controlling the active terminator unit, and wherein each of the memory units also includes an active terminator unit for terminating the data bus. In this case, when data is to be read from the memory units mounted on memory modules that are connected to connectors, the controller renders inactive an active terminator unit only of a memory unit from which data is to be read, and renders active the active terminator units of the other memory units and of the data bus controller.

Further, when data is to be written to the memory units, the controller renders inactive the active terminator unit of the data bus controller, and renders active the active terminator units of the memory units.

The memory device further comprises:

a clock controller for transmitting complementary clocks; and multiple memory units electrically connected to the pair of clock buses, wherein each of the memory units includes a differential coupling terminating circuit for terminating the pair of clock buses. The differential coupling terminating circuit may be incorporated in each of the memory units, or may be externally provided for each of the memory units.

According to a further aspect of the present invention, a memory device comprises:

a clock controller for transmitting complementary clocks; and multiple memory units electrically connected to a pair of clock buses, wherein each of the memory units includes an active terminating circuit for terminating the pair of clock buses.

According to a still further aspect of the present invention, a memory device comprises:

multiple memory units, electrically connected to a bus through connectors and stubs thereof; and a controller, electrically connected to one end of the bus, for controlling a reading operation and a writing operation relative to the memory units, wherein the bus between the controller and the multiple memory units, connectors, resistors and stubs is connected so that a substantially equal impedance is obtained along the bus relative to the controller and the memory units. In this case, it is preferable that the controller and the multiple memory units be joined together by star connection along the bus.

The bus is a data bus or a command address bus, and the controller and the memory units are connected not only by the bus, but also by a pair of clock buses along which complementary clocks are provided. The clock buses between the controller and the memory units, connectors and stubs are connected so that a substantially equal impedance is obtained along the clock buses relative to the controller and the memory units. The controller and the memory units are joined together by star connection along the pair of clock buses.

Further, the clock buses between the controller and the memory units, the connectors and the stubs may be connected so that a substantially equal impedance is obtained along the clock buses relative to the controller and the memory units. In this case, the controller and the memory units are joined together by star connection along the clock buses.

According to the present invention, the memory device further comprises:

a command address bus for connecting the memory units to multiple connectors; and a bus controller, connected to one end of the command address bus, for exchanging data with the memory units across the command address bus. In this case, the bus controller includes an active terminator unit that is rendered active when data is to be received from the memory units, and that is maintained inactive when command address data is to be written in the memory units.

According to one more aspect of the invention, a memory device comprises:

multiple memory units electrically connected to a command address bus; and a bus controller, connected to one end of the command address bus to control a reading operation and a writing operation relative to the memory units, wherein the bus controller includes an active terminator unit and a controller for controlling the active terminator unit, and wherein each of the memory units also includes an active terminator unit for terminating the command address bus. In this case, when data is to be received from the memory units that are mounted in memory modules connected to connectors, the controller renders inactive an active terminator unit only of a memory unit from which data is to be read, and renders active the active terminator units of the other memory units and the bus controller. Further, when command address data is to be written in the memory units, the controller renders the active terminator unit of the data bus controller inactive and renders the active terminator units of the memory units active.

Furthermore, the present invention can be applied for a memory device wherein memory units connected to a bus can be mounted in each slot. In this case, the active terminator unit of a memory unit from which data is received may be rendered inactive, and the active terminator unit that is provided for the slot of this memory unit may be rendered inactive. According to this configuration, while a signal is reflected on the data reception side, the signal amplitude can be increased.

DESCRIPTION OF THE PREFERRED EMBODIMENTS

Figure 1:
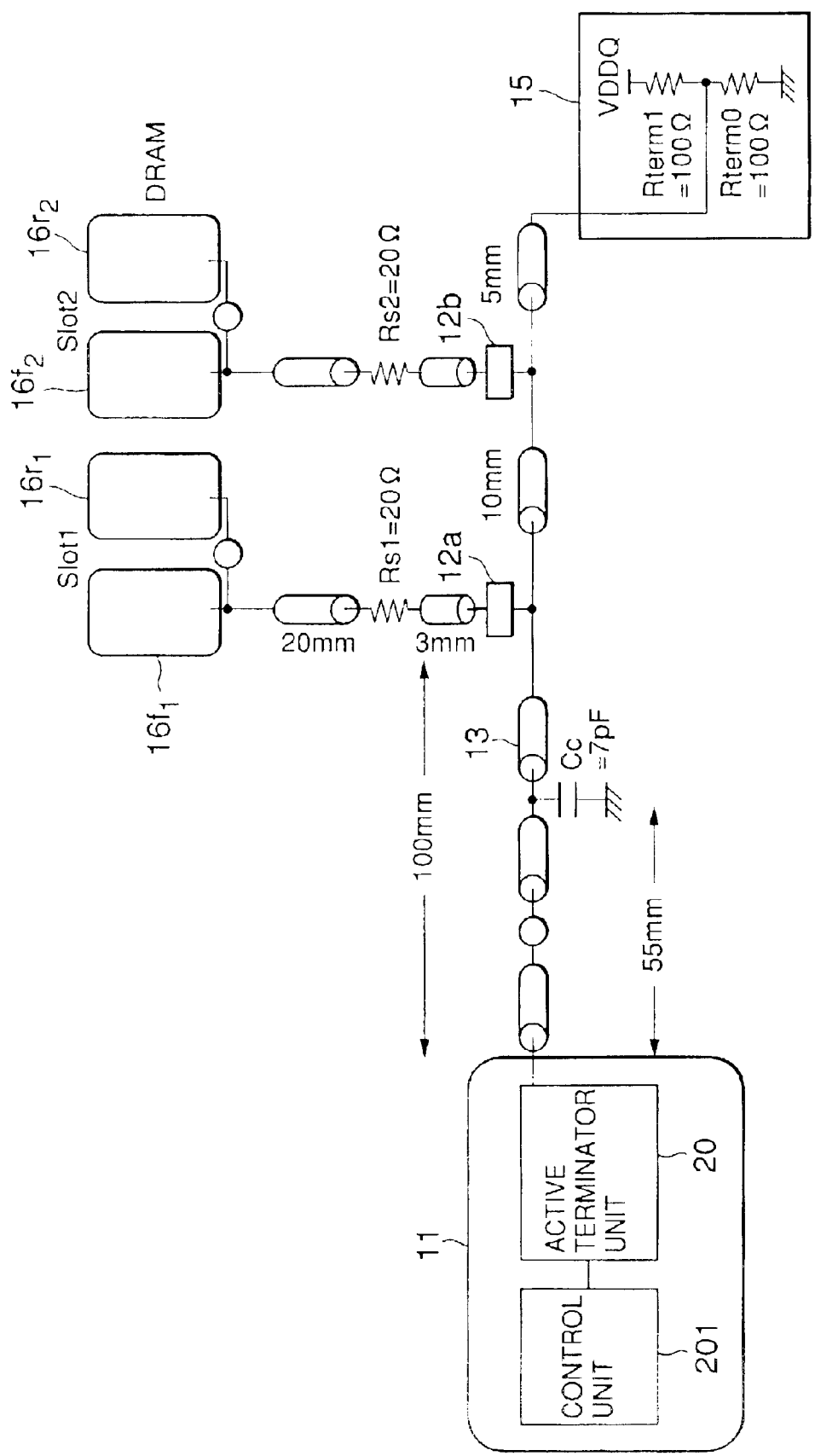
FIG. 1 is a wiring diagram showing a memory device according to one embodiment of the present invention.

Referring to FIG. 1, description will be made about a memory device according to a first embodiment of the present invention. The memory device in FIG. 1 is operated in accordance with SSTL, and a controller 11 and multiple connectors (in this embodiment, connectors 12a and 12b) are mounted on a motherboard (not shown). A slot wherein connection terminals are arranged is provided for the connectors 12a and 12b, and in FIG. 1, the connection terminals of the connectors 12a and 12b and the controller 11 are connected by a data bus 13 that is wired or printed on the motherboard. While multiple buses are actually arranged on the motherboard, for simplification of the explanation, only one data bus 13, horizontally extended in FIG. 1, is shown in this example. One end of the data bus 13 is connected to the controller 11, and the other end is connected to a terminating set 15 that will be described later. While a command address bus has the same topology as the data bus, for simplification, only the data bus 13 will be explained. The cylindrical and circular elements shown along the data bus 13 respectively represent distributed constant paths and via holes.

The memory device in FIG. 1 includes multiple DRAMs 16, which are arranged on the obverse and reverse sides of a memory module mounted substrate and serve as memory units. Specifically, a memory module that is mounted in the slot of the connector 12a includes DRAMs 16f1 and 16r1, and a memory module that is mounted in the slot of the connector 12b includes DRAMs 16f2 and 16r2. The DRAMs 16f1 and 16r1 are electrically connected by the via hole, as are the DRAMs 16f2 and 16r2.

The DRAMs 16f1 and 16r1 and the DRAMs 16f2 and 16r2 on the memory modules are attached to the connectors 12a and 12b via stubs and resistors Rs1 and Rs2 that in FIG. 1 are extended vertically. In this example, the stubs are 3 mm and 20 mm long, and the resistors Rs1 and Rs2 each have a resistance of 20Ω.

The data bus 13 of the memory device can be sorted into a first data bus segment extended between the controller 11 and the connector 12 nearest the controller 11, a second data bus segment extended between the connectors 12a and 12b and a third data bus segment extended between the connector 12b and a terminating set or circuit 15. In this example, the lengths of the first, the second and the third data bus segments are 100 mm, 10 mm and 5 mm, respectively.

Through the study performed by the present inventors, it was found out that, for the thus structured memory device, signal reflection occurs when data is read from each DRAM in accordance with a read command issued by the controller 11, and that the signal waveform was distorted due to the impedance mismatching between the controller 11 and the connector 12a.

In this embodiment, therefore, an active terminator unit, namely, active terminator 20 that is rendered active only during the reading operation of data from the DRAM 16 is included in the controller 11 connected to one end of the data bus 13. Also, let the wiring length between the connectors 12a and 12b be 10 mm, the signal transfer speed be seven pico seconds/mm, and the leading edge of the waveform be 0.7 nano second. Under the circumstances, it was also found out that the reflection of the signal and the distortion of the signal waveform that have occurred during the reading of data from the DRAM 16 can be suppressed by extending, to 100 mm or so, the wiring length of the first data bus segment printed or wired between the controller 11 and the connector 12a nearest to the controller 11. When the first data bus segment becomes long, this data bus segment can substantially be handled as a distributed constant circuit, and the impedance of the first data bus segment can also be handled as the characteristic impedance of the distributed constant circuit.

In addition, it was found out that the distortion of the signal waveform can be preferably suppressed when an impedance compensation or correction capacitor Cc having a capacitance of about 7 pF is connected between the controller 11 and the connector 12a. In this embodiment, the impedance compensation capacitor Cc is connected at a distance of 55 mm from the controller 11, i.e., at a distance of 45 mm from the connector 12a.

This means that the characteristic impedance of the first data bus segment will be rendered smaller than the characteristic impedances of the other data bus segments. When the characteristic impedance of the first data bus segment, between the controller 11 and the nearest connector 12a, is less than the characteristic impedances of the other segments, the reflection appearing on a readout waveform is reduced. As a result, the waveform is improved on the readout waveform.

As mentioned before, the wiring length of the first data bus segment, provided between the controller 11 and the nearest connector 12a, is increased, and the characteristic impedance is reduced. With this structure, the return of a reflection wave that may appear during the readout operation of data is delayed, and distortion of the waveform attributable to the reflection wave is suppressed. Therefore, in this embodiment, reflection prevention means is constituted by the wiring between the controller 11 and the nearest connector 12a, for which the length has been adjusted and/or for which the correction capacitor has been provided.

The DRAM 16 is operated by a low power voltage of $V_{DDQ}$, which is as low as 1.8 V and which is supplied by a power source VDDQ. In this case, the voltage $V_{DDQ}$ is also obtained from the power source of the DRAM 16 and is applied to the terminating set 15 connected to the other end of the data bus 13. As is shown in FIG. 1, the terminating set 15 is designed so that 100Ω resistors are connected in series between the power source and the ground, and a voltage of 0.9 V, obtained from the contact point of the series resistors, is applied to the data bus 13. Therefore, it is apparent that the terminating set 15 is constituted by a center tap terminating set. When the center tap terminating set is so employed, the power source of the memory element in the DRAM 16 can also be used as the power source for the terminating set 15, thereby eliminating the need for a superfluous power source.

Figure 2:
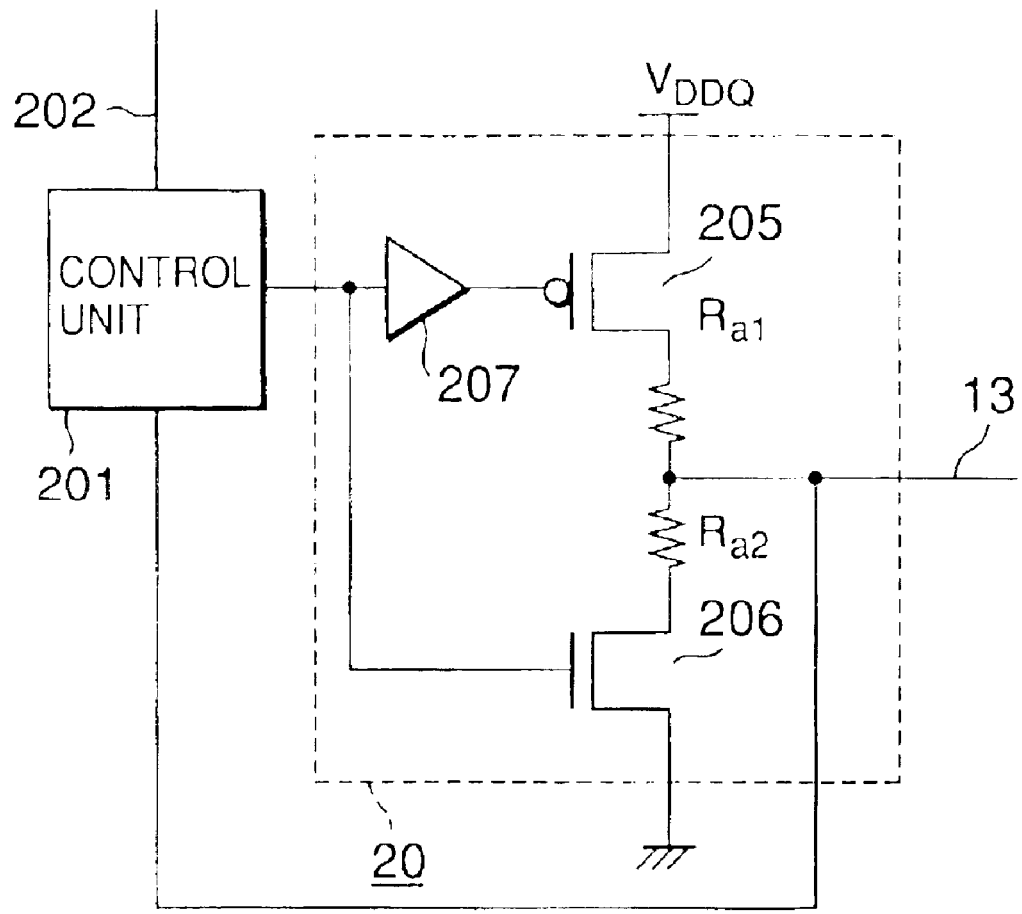
FIG. 2 is a diagram showing an active terminator unit or an active terminator used for the controller of the memory device in FIG. 1.

The active terminator circuit 20 provided for the controller 11 will now be described while referring to FIGS. 1 and 2. Briefly, the active terminator circuit 20 is rendered active only during the readout operation of data from the DRAM 16, and terminates the data bus 13. As is shown in FIG. 2, the active terminator circuit 20 is connected to a control unit 201, which outputs a read control signal Rc or a write control signal Rcbar to the active terminator circuit 20. In addition, the control unit 201 outputs write data to the data bus 13, and receives readout data from the data bus 13. The control unit 201 is further connected, by a command address line 202, to the DRAMS 16f1, 16r1, 16f2 and 16r2 to which it outputs a write or read command along the command address line 202 (FIG. 2).

The active terminator circuit 20 in FIG. 2 includes a series circuit that is constituted by a P channel MOS transistor 205, a first resistor Ra1 of 500Ω, a second resistor Ra2 of 500Ω, and an N channel MOS transistor 206. The series circuit is connected between the terminal of the power source VDDQ and the ground potential terminal. As is shown in FIG. 2, the source of the P channel MOS transistor 205 is connected to the power source terminal, and the source of the N channel MOS transistor 206 is grounded. The first resistor Ra1 and the second resistor Ra2, which are connected in series, are connected between the drains of the MOS transistors 205 and 206. The gate of the P channel MOS transistor 205 is connected to the control unit 201 through an inverter 207, and the gate of the N channel MOS transistor is connected directly to the control unit 201.

With this configuration, upon receiving a read control signal Rc from the control unit 201, the MOS transistors 205 and 206 are rendered on and the active terminator circuit 20 is rendered active and applies a voltage of $V_{DDQ}/2$ to the data bus 13. As a result, the data bus 13 is terminated by the active terminator circuit 20, and the data that, in accordance with the read command, is read from the DRAM 16 is transmitted to the control unit 201. Then, when a write control signal Rcbar is received from the control unit 201, the MOS transistors 205 and 206 are rendered off, and the active terminator circuit 20 is rendered inactive, i.e., is set to an invalid state, and releases one end of the data bus 13. In this state, the write data received from the control unit 201 is output to the data bus 13 in accordance with the write command and is written in a pertinent DRAM 16.

Since the controller 11 includes the active terminator circuit 20 that is rendered inactive during the writing operation of data and is rendered active only during the reading operation of data when the value of the terminal resistor in the active state is selected, signal reflection between the data bus 13 and the controller 11 is prevented during the reading of data.

According to the example in FIG. 1, since reflection can also be prevented between the data bus 13 and the DRAMS 16f1, 16r1, 16f2 and 16r2, which are connected through the connectors 12a and 12b and the stubs, data can be read without any influence of reflection rapidly.

Figure 3:
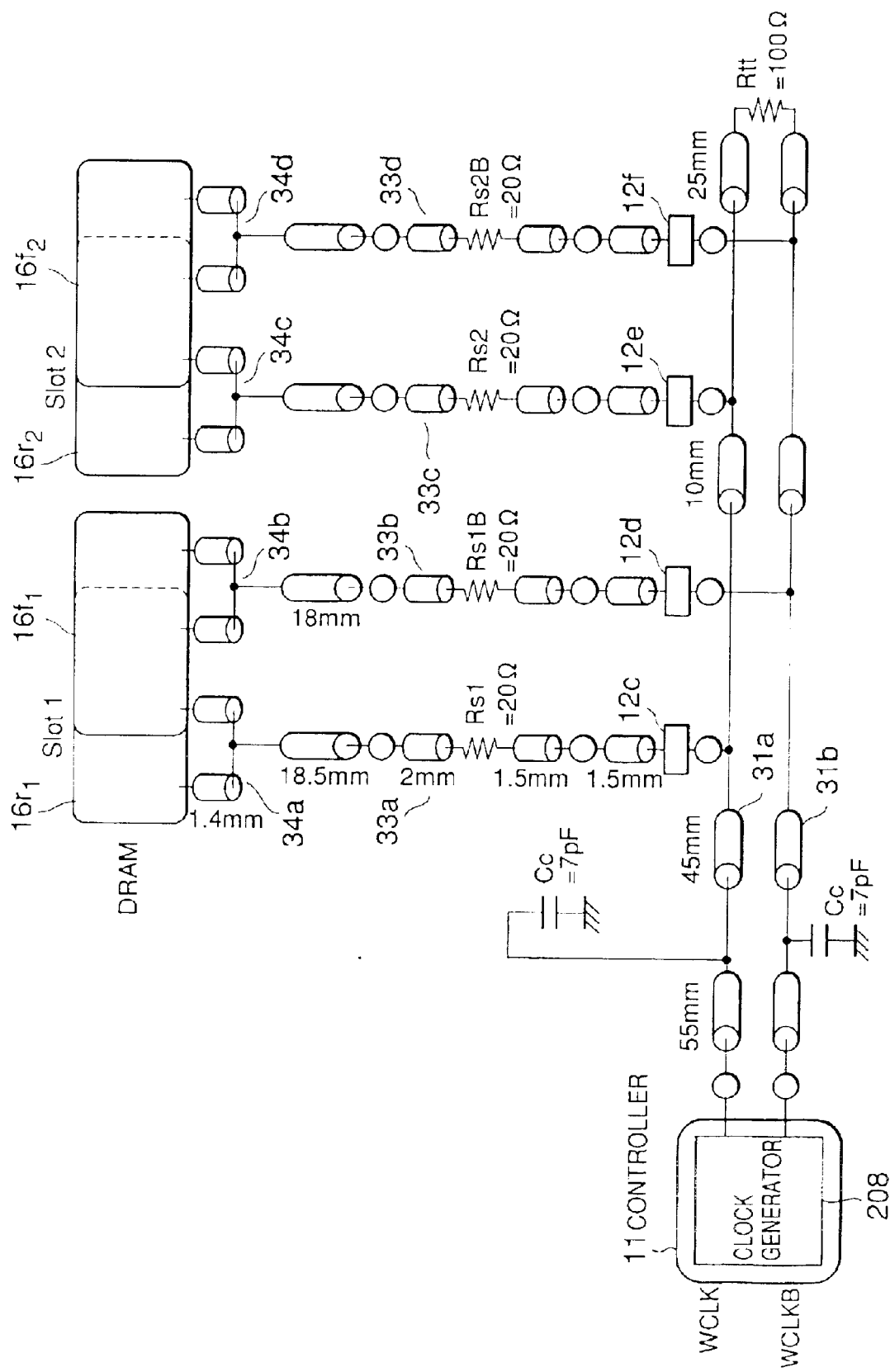
FIG. 3 is a diagram showing the topology for a clock bus that can be applied for the memory device in FIG. 1.

A memory device that includes clock buses 31a and 31b will now be described while referring to FIG. 3. The memory device in FIG. 3 employs a differential clock, and the clock buses 31a and 31b include a differential signal wiring structure. The clock buses 31a and 31b in FIG. 3 are structured so that they can be used in common with the data bus 13 of the memory device in FIG. 1. Specifically, the memory device in FIG. 3 includes the controller 11, arranged on the motherboard, and the clock buses 31a and 31b, which extend from the controller 11 on the motherboard. The controller 11 in FIG. 3 includes not only the active terminator circuit 20 and the control unit 201 in FIG. 1, but also a clock generator 208, which is connected to the clock buses 31a and 31b and which outputs complementary clocks WCLK and WCLKB to the clock buses 31a and 31b.

Since an ordinary clock generator can be used as the clock generator 208 for generating the complementary clocks WCLK and WCLKB, no further explanation will be given for it. And since the complementary clocks are transmitted to the memory units (i.e., the DRAMs 16) of the individual memory modules, the leading edges and trailing edges of the clock can be precisely detected in the memory units.

In the example illustrated in FIG. 3, the clock WCLK, which is output by the controller 11 along the clock bus 31a, is transmitted through a connector 12c and a stub 33a to a branching unit 34a, and is given by the branching unit 34a to the DRAMs 16f1 and 16r1, which are respectively arranged on the obverse and reverse sides of the memory module. Furthermore, the clock WCLKB, which is output along the clock bus 31b, is transmitted through a connector 12d, a stub 33b and a branching unit 34b, and is supplied to the DRAMs 16f1 and 16r1 arranged on the obverse and reverse sides of the memory module.

Similarly, the complementary clocks WCLK and WCLKB are transmitted through connectors 12e and 12f, stubs 33c and 33d and branching units 34c and 34d to the DRAMs 16f2 and 16r2. It should be noted that the connectors 12c and 12d are provided in the slot (slot1) wherein the connector 12a in FIG. 1 is arranged, and the connectors 12e and 12f are provided in the slot (slot2) wherein the connector 12b is arranged.

The memory device having the configuration in FIG. 3 has a differential coupling terminating circuit wherein the ends of the clock buses 31a and 31b on one side are connected to the controller 11, and the ends on the other side are interconnected by a terminal resistor Rtt, which has a resistance of 100Ω. When the ends of the clock buses 31a and 31b are terminated by the differential coupling terminating circuit, improved terminating effects can be provided for the differential elements of the clocks WCLK and WCLKB. Further, since no power source is required for the terminating circuit for this configuration, the cost can be reduced.

In this example, the distance between the terminal resistor Rtt and the connector 12e or 12f is defined as 25 mm, and the distance between the connector 12c or 12d preceding the terminal resistor Rtt and the connector 12e or 12f is defined as 10 mm. In addition, the distance between the controller 11 and the connector 12c or 12d is defined as 100 mm, and an impedance compensation capacitor Cc, which has a capacitance of 7 pF and is located at a distance of 55 mm from the controller 11, is provided at the location nearest the controller 11. When the distance between the connector 12e or 12f and the terminal resistor Rtt is extended, the clock bus segment therebetween can be handled as a distributed constant circuit, and the signal amplitude at the AC time, i.e., at the time of a signal change, can be increased. As is apparent from the previous description, the impedance compensation capacitor Cc is connected at a position remote from the controller 11 or the DRAM when either one of the controller 11 and the DRAM operates as the reception side. Since the impedance compensation capacitor Cc is distant from the reception side, the reflection from a reception side can be reduced.

The DRAMs and the connectors in FIG. 3 are interconnected by the stubs 33a, 33b, 33c and 33d. In FIG. 3, each length of these stubs 33a to 33d is 23.5 mm, and stub resistors Rs1, Rs1B, Rs2 and Rs2B of 20Ω are inserted near the connectors for the stubs 33a to 33d, and serve as concentrated constant elements.

It should be noted that it was found that crosstalk noise can be reduced by shielding the illustrated clock buses 31a and 31b from the other data bus 13. It has been confirmed that the signal amplitude at a signal transition time can be increased when the length of the clock bus between the terminal resistor Rtt and the immediately preceding connector (the distance between the terminal resistor Rtt and the connector 12e or 12f) is selected within a range of 10 to 25 mm.

Further, only one pair of the clock buses 31a and 31b may be provided for eight data buses 13, i.e., the paired clock buses 31a and 31b may be provided for every byte. In this event, variances in the timing can be reduced, as compared with the case where the clock buses are provided for more data buses. Specifically, when the clock bus structure in FIG. 3 is assembled with the structure having eight of the data buses shown in FIG. 1, i.e., when the clock buses 31a and 31b are provided for each byte lane, the timing margin can be considerably increased. In addition, when the clock buses 31a and 31b are shielded from the other data buses, crosstalk noise can be further reduced.

As is described above, the DRAMs 16f1 and 16r1 and the DRAMs 16f2 and 16r2 in FIGS. 1 and 3 are mounted as memory units on the obverse sides and the reverse sides of the memory module mounting substrates, and these substrates are detachably inserted into the slots formed on the motherboard. In other words, the memory device in FIG. 1 or 3 includes multiple slots, and the memory units connected to the bus are mounted in the slots. Taking this configuration into account, two memory units that are subjected to termination control may be provided for each slot, and this can be applied for the other embodiments.

A memory device according to another embodiment of the present invention will now be described with reference to FIG. 4. In the memory device illustrated in FIG. 4, a controller 11 includes an active terminator circuit 20 and a control unit 201, which correspond to the active terminator circuit 20 and the control unit 201 in FIG. 2, respectively. The memory device includes, as memory units, DRAMs 16f1 and 16r1 and DRAMs 16f2 and 16r2, which are mounted on the obverse and reverse sides of memory modules. These memory modules are inserted into slots (slot1 and slot2) for connectors 12a and 12b. Further, like in FIG. 1, the DRAMs 16f1 and 16r1 and the DRAMs 16f2 and 16r2 are respectively connected electrically to the branching units and stubs of the connectors 12a and 12b.

The DRAMs 16f1, 16r1, 16f2 and 16r2 differ from those in FIG. 1 in that they are terminated by active terminator units 161 to 164. While the active terminator units 161 to 164 may be incorporated in the individual DRAMs or be externally attached thereto, in this embodiment, the active terminator units 161 to 164 in FIG. 4 are assumed to be connected before the input buffers of the DRAMs 16f1 to 16r2 in the illustrated example.

At any rate, the illustrated active terminator units 161 to 164 are structured so that they are activated when data is to be written to the DRAMs 16f1 to 16r2, and are not activated for the reading of data. When these active terminator units 161 to 164 are employed, the power source for driving them may be used in common with that of the DRAMs, so that costs can be reduced, in comparison with the case where the terminator power sources are placed for the individual active terminator units on the motherboard.

As is described above, the DRAMs 16f1 and 16r1 are connected to the controller 11 through the connector 12a and the data bus 13, and similarly, the DRAMs 16f2 and 16r2 are connected to the controller 11 through the connector 12b and the data bus 13. The DRAMs 16f1 to 16r2 are connected to the controller 11 also through a command bus for exchanging write commands and read commands, a control signal line for exchanging various types of control signals, a command address register and a relay circuit. To simplify the drawing, the command bus, the control signal lines for exchanging various types of control signals, the command address register and the relay circuit are not shown in FIG. 4.

In this configuration, when data is read from a specific DRAM (the DRAM 16f1 in this case) of the DRAMs 16f1, 16r1, 16f2 and 16r2, the control unit 201 of the controller 11 issues a read command to the specific DRAM 16f1 across the command bus (not shown). In this event, the control unit 201 of the controller 11 transmits a termination control signal across the control signal line, so as to put in the operating state, i.e., the active state, all the active terminator units 161 to 164 of the DRAMs 16f1 to 16r2 that are connected to the connectors 12a and 12b. When the specific DRAM 16f1 that received the read command is ready to read data, an output enable signal is internally generated. Then, for the specific DRAM 16f1 wherein the output enable signal is internally generated, the active terminator unit 161 is put into the non-operating state, i.e., rendered inactive, and while data is read from the specific DRAM 16f1, the active terminator units 162, 163 and 164 of the other DRAMs that did not receive the read command are maintained in the operating state.

Figure 5:
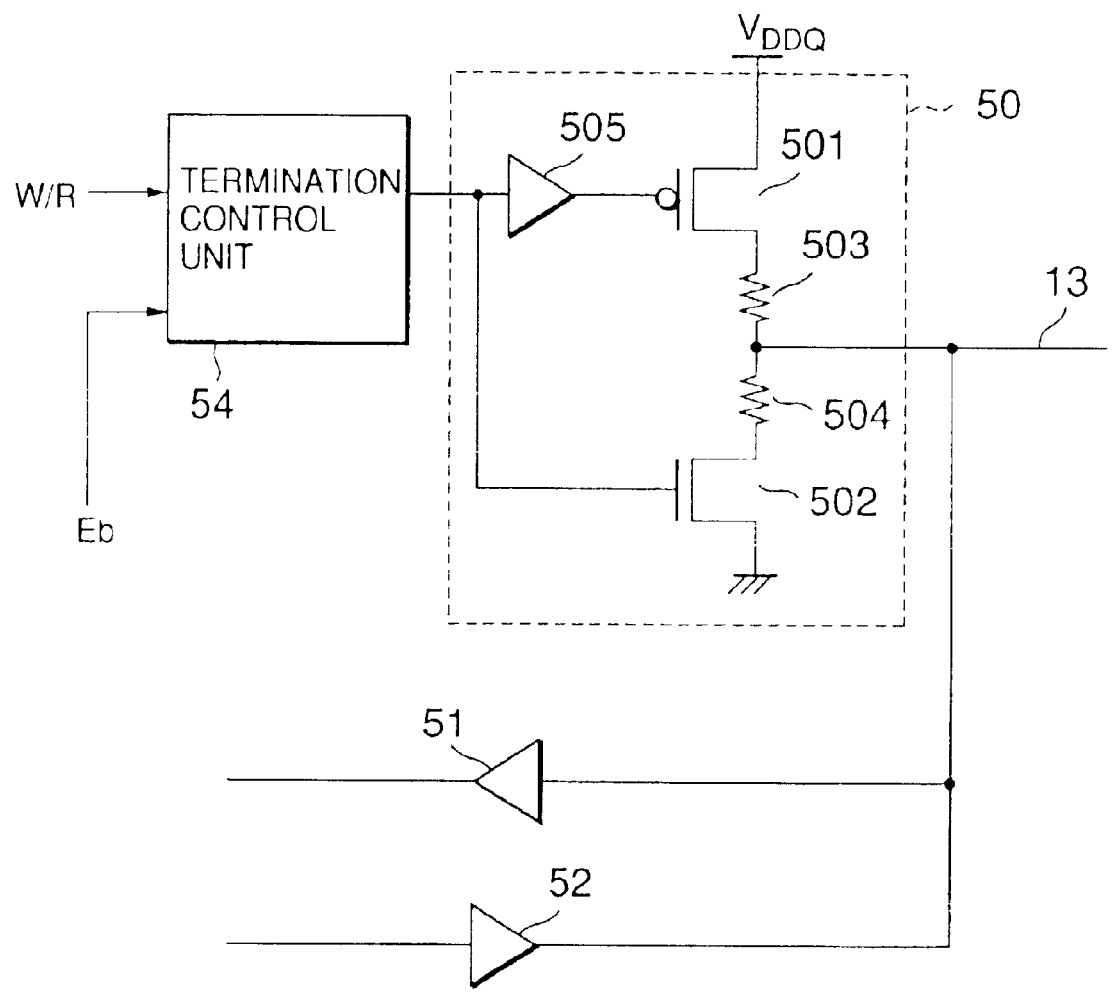
FIG. 5 is a circuit diagram showing an active terminator unit that is used for the DRAM that is presented as a memory unit in FIG. 4.

The data that is read from the DRAM 16f1 is transmitted along the data bus 13 to the controller 11. Like in FIG. 1, an active terminator circuit 20 in FIG. 5 is provided for the controller 11, and as explained with reference to FIG. 5, in accordance with the read control signal received from the control unit 201, the active terminator circuit 20 is set in the operating state, i.e., is rendered active to output a read command.

As a result, the data read from the DRAM 16f1 is output to the controller 11 like in FIG. 1, without being reflected by the connector 12a and the data bus 13.

When data is to be written to the DRAM 16f1, the control unit 201 outputs a write command across the command bus to the DRAM 16f1, and outputs a termination control signal to the DRAMs 16f1, 16r1, 16f2 and 16r2 connected to the data bus 13. In this case, a write control signal is transmitted to the active terminator circuit 20 of the controller 11, and the active terminator circuit 20 is rendered inactive and is released.

Upon receiving the termination control signal, first, the active terminator units 161 to 164 of the DRAMs 16f1 to 16r2 are rendered active, during the reading operation. Further, upon receiving a write command, the specific DRAM 16f1 is set to the write enabled state, and internally generates an output enabled signal. During the writing operation, the active terminator unit 161 of the DRAM 16f1 is maintained active, as are the active terminator units 162 to 164 of the other DRAMs. In this state, the write data is written by the control unit 201 of the controller 11 across the data bus 13 to the DRAM 16f1. At this time, the DRAM 16f1 is terminated by the active terminator unit 161, and so long as an appropriate value is set for the terminal resistor in the active state, a reflection by the DRAM 16f1 can be prevented. As is described above, when the data is to be written to the DRAM 16f1 by the controller 11, only the active terminator circuit 20 of the controller 11 is rendered inactive, while all the active terminator units 161 to 164 of the DRAMs located on the data reception side, including the DRAM 16f1, are rendered active.

The reading and writing operations will now be generally explained. When the reading operation is started, the active terminator circuit 20 of a specific DRAM 16 from which data is to be read is rendered inactive, and the active terminator units 20 of the other DRAMs 16 and the controller 11 are maintained active. When the writing operation is started, only the active terminator circuit 20 of the controller 11 is rendered inactive, and all the active terminator units 161 to 164 of the DRAMs 16 on the data reception side are maintained active.

Since the active terminator unit on the data transmission side is rendered inactive (i.e., OFF), and the active terminator units on the data reception side are rendered active (ON), it is possible to implement a memory device with less reflection. Further, although in the above embodiment, description has been made on the assumption that all the active terminator units of the DRAMs on the data reception side are rendered ON during the write operation, the present invention is not limited to this structure. For example, only the DRAM of a slot to which data is to be written may be rendered off, while the active terminator units of the DRAMs of the other slots may be rendered on. In this case, while a signal is reflected on the data reception side, the signal can be easily captured because the signal amplitude is increased.

Referring to FIG. 5, an explanation will now be given for an example circuit that can be used for the active terminator units 161 to 164 of the DRAMs 16f1, 16r1, 16f2 and 16r2 in FIG. 4. As is shown in FIG. 5, the active terminator unit of the DRAM includes a terminating unit 50, a reception unit 51 that is operated during the writing of data, a transmission unit 52 that is operated during data reading, and a termination control circuit 54. During the data writing operation, the reception unit 51 writes, in the memory element of the DRAM, write data received from the data bus 13, and during the data reading operation, the transmission unit 52 outputs to the data bus 13 the data read from the memory element.

The termination control circuit 54 is operated in response to a write/read control signal W/R transmitted along with the control signal and an output enable signal Eb that is generated in the DRAM. Specifically, upon receiving the write control signal W from the control unit 201 of the controller 11, the termination control circuit 54 outputs a high (H) level signal to the termination unit 50 as a termination control signal. When the read control signal R is received and when the output enable signal Eb is generated in the DRAM, the termination control unit 50 outputs a low (L) level signal to the terminating unit 50 as a termination control signal. And when the output enable signal Eb is not generated even upon the reception of the read control signal R, the termination control circuit 54 outputs the H level signal. Since the termination control circuit 54 can be implemented by a simple logical circuit, no detailed explanation for it will be given.

The terminating unit 50 includes a P channel MOS transistor 501, the source of which is connected to the power source terminal for applying a power source voltage VDDQ; and an N channel MOS transistor 502, the source of which is connected to the GND terminal. Two resistors 503 and 504 are connected in series between the drains of the MOS transistors 501 and 502, and the data bus 13 is connected to the common contact point of the resistors 503 and 504. Further, a termination control signal is transmitted by the termination control circuit 54 through an inverter 505 to the gate of the P channel MOS transistor 501, and is also directly transmitted to the gate of the N channel MOS transistor 502.

With this configuration, when the H level signal is transmitted as a termination control signal by the termination control circuit 54, the MOS transistors 501 and 502 are rendered on, and as a result, the termination unit 50 is rendered active. In this state, the power source voltage VDDQ is divided by the resistors 503 and 504, and the data bus 13 is terminated at a voltage determined by the voltage division ratio of the resistors 503 and 504. When the resistors 503 and 504 have the same resistance, the data bus 13 is terminated inside the DRAM at a voltage of ($V_{DDQ}/2$). Then, when the L level signal is transmitted as a termination control signal to the termination control circuit 54, the MOS transistors 501 and 502 are rendered off, and the termination unit 50 is rendered inactive. Following this, when the DRAMs are terminated by using the terminator units described above, the operation can be performed in the manner mentioned with reference to FIG. 4.

Figure 4:
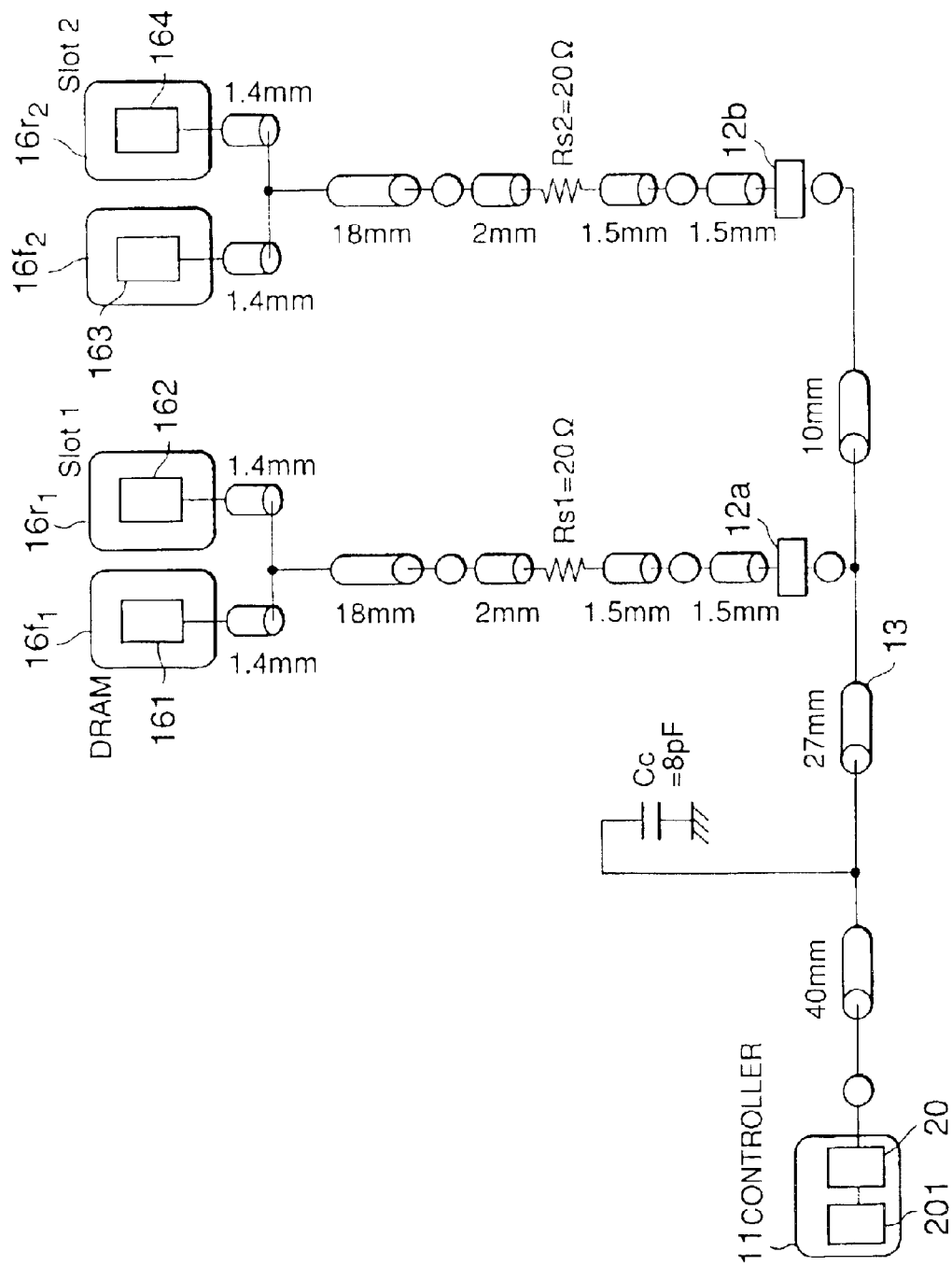
FIG. 4 is a wiring diagram for explaining a memory device according to another embodiment of the present invention.
Figure 6:
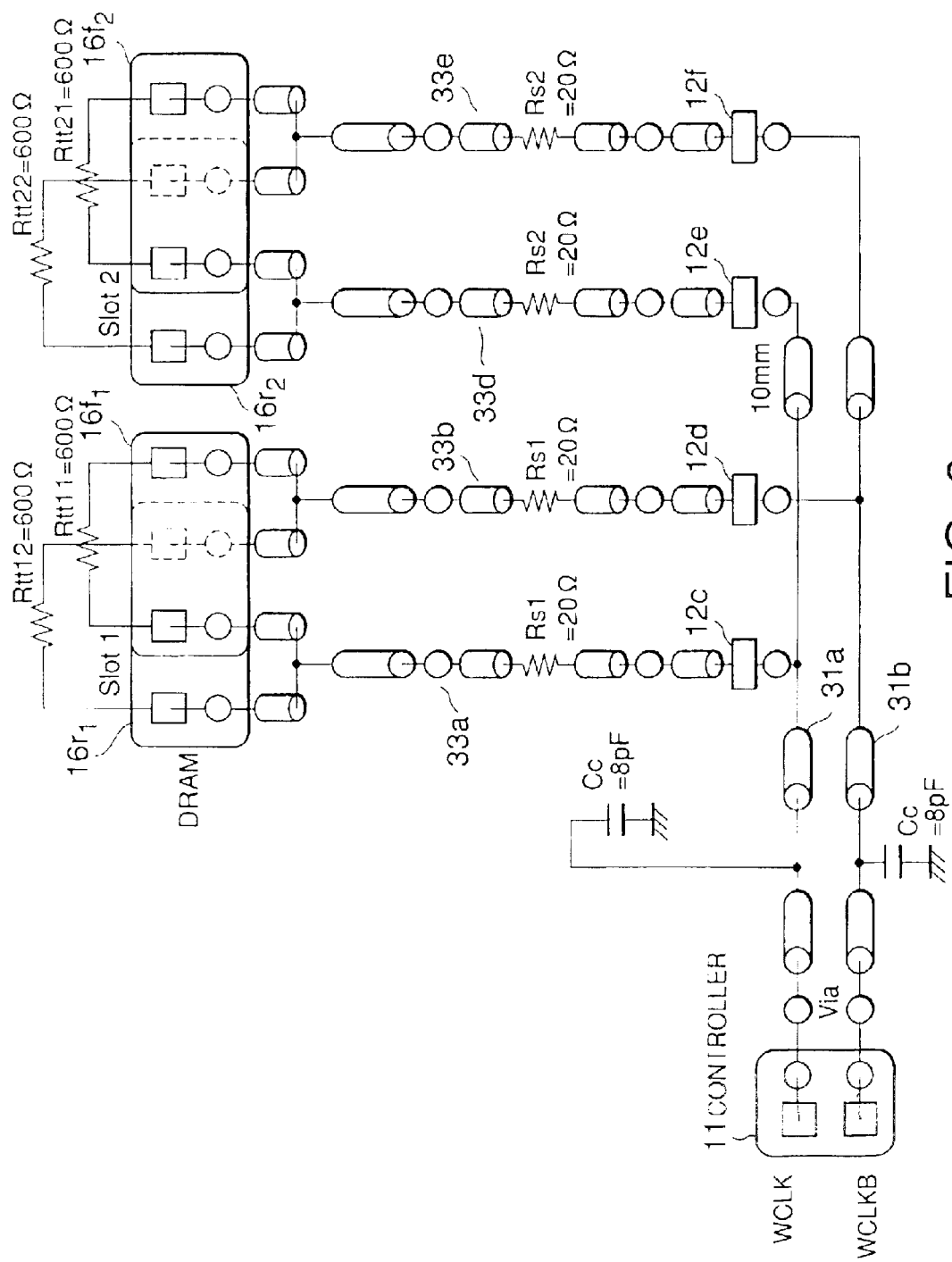
FIG. 6 is a wiring diagram for explaining a clock bus that can be used for the memory device in FIG. 4.

In FIG. 6 is shown the clock bus structure appropriate for the data bus of the memory device in FIG. 4. The memory device in FIG. 6 differs from the memory device in FIG. 3 in that differential coupling termination resistors Rtt1 and Rtt2 are provided for the DRAMs 16f1, 16r1, 16f2 and 16r2 that serve as memory units. The differential coupling termination resistors Rtt1 and Rtt2 have a resistance of 300Ω, and are connected between a pair of clock buses across which the complementary clocks WCLK and WCLKB are to be transmitted to the DRAMs. The circles and the rectangles provided for the individual DRAMs specifically represent the pins and pads of packages.

More specifically, the clock bus 31a is connected through the connectors 12c and 12e to the stubs 33a and 33d, and the clock bus 31b is connected through the connectors 12d and 12f to the stubs 33b and 33e. The stub 33a is branched by the branching unit to obtain two branches, and these branches are connected to the DRAMs 16f1 and 16r1. The stub 33b connected to the block bus 31b through the connector 12d is branched by the branching unit, and these branches are connected to the DRAMs 16f1 and 16r1. Using this arrangement means that the clock bus 31a will be branched to obtain two branches, which are connected to the two DRAMs 16f1 and 16r1 that are mounted on the obverse and reverse sides of the memory module, and also means that the clock bus 31b will be electrically connected to the two DRAMs 16f1 and 16r1. With this arrangement, the clocks WCLK and WCLKB are transmitted to the DRAM 16f1 and also to the DRAM 16r1.

Similarly, the clock bus 31a is connected to the DRAMs 16f2 and 16r2 through the stub 33d and the branching unit connected to the connector 12e, while the clock bus 31b is also connected to the DRAMs 16f2 and 16r2 through the stub 33d and the branching unit. Therefore, the clocks WCLK and WCLKB are transmitted to the DRAM 16f2 and also to the DRAM 16r2. In the example in FIG. 6, the pair of clock buses leading to the DRAMs 16f1 and 16f2 are terminated by the differential coupling termination resistors Rtt1 and Rtt2 that are externally provided for the DRAMs 16f1 and 16f2. On the other hand, these termination resistors are not provided for the DRAMs 16r1 and 16r2 that are mounted on the reverse sides of the DRAMs 16f1 and 16f2; however, the DRAMs 16r1 and 16r2 may also be terminated by the termination resistors. In this example, the differential coupling termination resistors Rtt1 and Rtt2 for the DRAMs 16 have been attached externally; however, these resistors may be incorporated with the memory elements of the DRAMs 16.

As is shown in the example, the termination resistors Rtt1 and Rtt2 are provided only for the DRAM mounted either on the obverse or on the reverse side of each memory module. When these termination resistors Rtt1 and Rtt2 are selectively changed, a variety of writing/reading operations can be performed. Since by using the differential coupling termination resistors no power source is required for the terminating set, the memory device cost can be reduced, and when this configuration and the data bus structure in FIG. 4 are employed together, the effects obtained will be increased.

Figure 7:
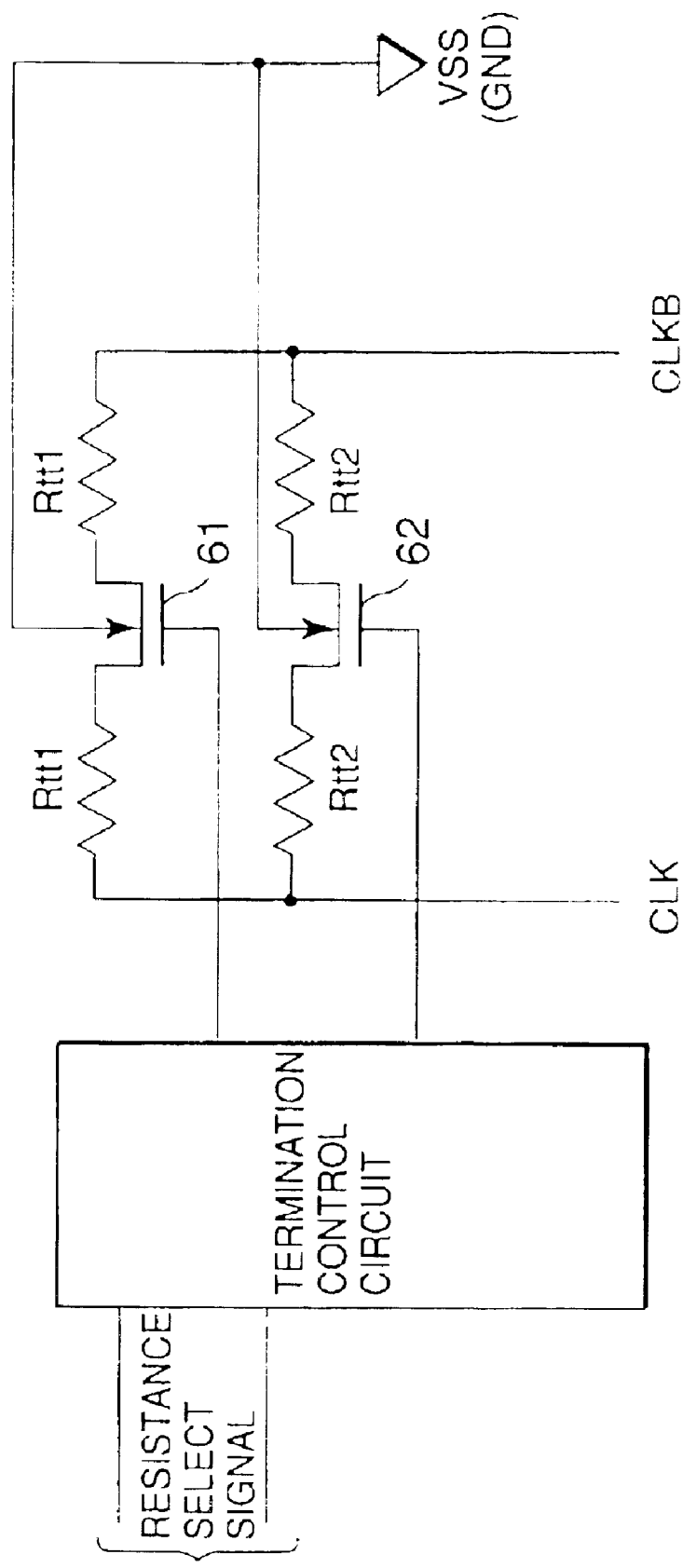
FIG. 7 is a circuit diagram showing an example active terminator unit that can be used for a clock for the DRAM that is presented as a memory unit in FIG. 4.

The above-mentioned explanation has been made with reference to FIG. 6 about the configuration wherein the ends of the clock buses 31a and 31b nearest to the DRAMs are terminated by the differential coupling termination resistors. However, as is shown in FIG. 7, instead of the differential coupling termination resistors, the clock buses may be terminated by an active terminator unit that employs the switching of the MOS transistors to turn the resistors on or off. Further, it is preferable that the active terminator unit in FIG. 7 is incorporated in the DRAM. As is also apparent from FIG. 7, a resistance select signal and complementary clocks CLK and CLKB (e.g., WCLK and WCLKB), which will be described later, are transmitted to the active terminator unit. With this configuration, the termination resistance of the active terminator unit can be changed in accordance with the resistance select signal.

It is, preferable that the termination resistance of the active terminator unit is varied between when the DRAM is mounted only on the obverse side or on the reverse side of the memory module and when the DRAM is mounted on both sides of the memory module. Furthermore, it is preferable that the termination resistance of the active terminator unit is changed in accordance with the number of the memory modules attached to the slot or slots.

Taking these conditions into account, in the example in FIG. 7, a high level signal or a low level signal is transmitted as a resistance select signal by the memory module to the terminating control circuit of the active terminator unit. As a result, the resistance of the active terminator unit is changed in accordance with the memory module or the state of the slot. Upon the reception of the resistance control signal, the terminating control circuit outputs a corresponding logical signal "1" or "0" to the gates of a pair of N channel MOS transistors 61 and 62. One end of the resistor Rtt1 is connected to the drain and the source of the N channel MOS transistor 61, and the clocks CLK and CLKB are transmitted to the other end.

With this configuration, when the N channel MOS transistors 61 and 62 are selectively turned on or off, the terminal resistance of the active terminator unit can be changed to one of three levels. Therefore, the active terminator unit in FIG. 7 can vary the terminal resistance by taking the connection of the memory module into account, and the degree of design freedom can be increased.

Figure 8:
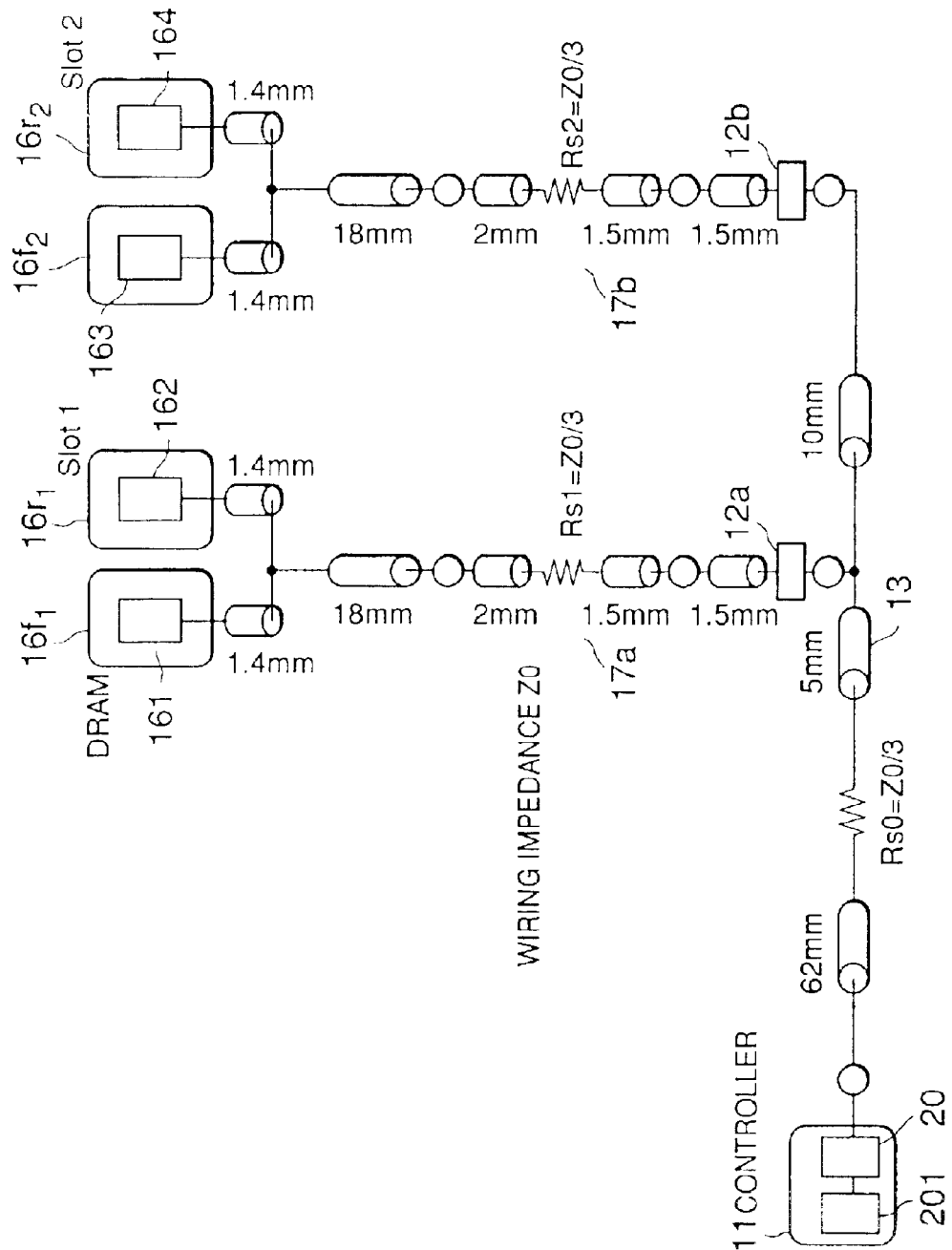
FIG. 8 is a diagram showing the topology related to the data bus of a memory device according to an additional embodiment of the present invention.

In FIG. 8 is shown a memory device according to an additional embodiment of the present invention. This memory device, like in FIG. 1, includes a controller 11 mounted on a motherboard, a data bus 13 that is connected to the controller 11 and connectors 12a and 12b that are electrically connected to the data bus 13. Further, DRAMs 16f1 and 16r1, which are memory units arranged on a memory module, are connected through a stub 17a to the connector 12a, while DRAMs 16f2 and 16r2 are connected through a stub 17b to the connector 12b. As is the case in FIG. 4, an active terminator unit is provided for the DRAMs, and this active terminator unit has the same configuration as the circuit in FIG. 5.

The same active terminator unit as that in FIG. 2 is provided for the controller 11. While a control unit 201 of the controller 11 performs the process, which will be described later, to perform termination control for an active terminator circuit 20 for the controller 11 and active terminator units for DRAMs 16f1, 16r1, 16f2 and 16r2.

In the memory device in FIG. 8, impedance is adjusted so that the impedance between the controller 11 and the connector 12a equals the sum of the impedance from the connector 12a toward the DRAMs 16f1 and 16r1 and the impedance from the connector 12b toward the DRAMs 16f2 and 16r2. Therefore, a resistor Rs0 is connected as a concentrated constant circuit element to the data bus 13, and resistors Rs1 and Rs2 are connected to stubs 17a and 17b. In this example, the resistances for the resistors Rs0, Rs1 and Rs2 are adjusted to Z0/3, where Z0 denotes the characteristic impedance of the data bus 13. As a result, the position at the connector 12a becomes a neutral point. In this event, the impedance seen from the neutral point toward the controller 11, the impedance seen toward the DRAMs 16f1 and 16r1 and the impedance seen toward the DRAMs 16f2 and 16r2 are all equal to one another. Thus, the reflection between the controller 11 and the DRAMs can be prevented. That is, the memory device is so designed that the controller 11 and the DRAMs 16f1, 16r1, 16f2 and 16r2 are joined together by star connection. Further, since the impedances along the individual lines of the star connection leading from the terminal (e.g., the controller 11 or each DRAM 16) are matched on the data transmission side, data reflection can be prevented.

This means that the data bus 13, the connectors, the resistors and the stubs between the controller 11 and the DRAMs are connected in the following manner. Namely, the impedance between the controller 11 and the point before the data bus 13 connected to the DRAMs is branched is substantially matched with the impedance seen from the branch point of the data bus 13 toward the rear side following the branch point of the data bus 13. When the example in FIG. 8 is generalized, the controller 11 and the DRAMs are connected along n lines having the same characteristic impedance Z0 and through the resistors having resistances of Z0/n. With this arrangement, impedance matching is apparently performed. It should, however, be noted that when the resistor Rs0 is not connected, the same effects can be obtained by adjusting the characteristic impedance along the wiring across the motherboard the memory modules.

As is described above, while the impedance matching state is maintained, the following termination operation is performed for data writing and reading. First, an explanation will be given for the processing whereby, under the control of the controller 11, data is read from the DRAM 16f1 or 16r1 connected to the connector 12a. During this processing, the active terminator unit of the DRAM 16f1 or 16r1 for a slot on the data transmission side is rendered inactive, while the active terminator circuit 20 of the controller 11 on the data reception side is rendered active, and the active terminator units of the DRAMs 16f2 and 16r2 are rendered also active, i.e., set to the operating state.

When the control unit 201 of the active terminator circuit 20 of the controller 11 reads data from the DRAM 16f2 or 16r2 connected to the connector 12b, the active terminator unit of the DRAM 16f2 or 16r2 is rendered inactive, i.e., is set in the non-operating state, and the active terminator units of the DRAMs 16f1 and 16r1 connected to the connector 12a are set in the operating state. At this time, the active terminator circuit 20 of the controller 11 on the data reception side is also rendered active. And as is described with reference to FIG. 2, the active terminator circuit 20 of the controller 11 is set in the operating state during the operation performed to read data from the DRAM.

When data is to be written to the DRAMS 16f1 and 16r1 connected to the connector 12a, the active terminator units of the DRAMs 16f1 and 16r1 and the DRAMs 16f2 and 16r2 are set in the operating state under the control of the controller 11. When data is to be written to the DRAMs 16f2 and 16r2 connected to the connector 12b, the active terminator units of the DRAMs 16f1 and 16r1 and the DRAMs 16f2 and 16r2 are set in the operating state under the control of the controller 11. At this time, the active terminator circuit 20 of the controller 11 on the data transmission side is rendered inactive, i.e., is released.

Since the active terminator circuit 20 of the controller 11 that performs the above operation, and the active terminator units of the DRAMs 16 can be implemented by the circuits shown in FIGS. 2 and 5, no further explanation for them will be given.

An explanation has been given for the termination operation whereby the active terminator unit on the data transmission side is rendered inactive, while all the active terminator units on the data reception side are rendered active. However, the active terminator unit on the data transmission side may be selectively rendered inactive, and from among the multiple active terminator units on the data reception side, only the active terminator unit that receives data may be rendered inactive while the remaining active terminator units may be rendered active. In this case, the DRAM on the data reception side is terminated by the active terminator units of the other DRAMs.

This operation will be more specifically explained. When data is to be read from the DRAMs 16f1 and 16r1 connected to the connector 12a, the active terminator units of the DRAMs 16f1 and 16r1 are rendered inactive, while the active terminator units of the other DRAMs 16f2 and 16r2 are rendered active, as is the active terminator circuit 20 of the controller 11. When data is to be read from the DRAMs 16f2 and 16r2 connected to the connector 12b, the active terminator units of the DRAMs 16f2 and 16r2 are rendered inactive, while the active terminator units of the other DRAMs 16f1 and 16r1 are rendered active, as is the active terminator circuit 20 of the controller 11. This operation, whereby the active terminator unit on the transmission side is selectively rendered inactive and the active terminator unit of the controller 11 on the data reception side is rendered active, is the same as the operation described above.

When data is to be written to the DRAM 16f1 or 16r1 connected to the connector 12a, the controller renders active the active terminator circuit 20 thereof; renders inactive only the active terminator units of the DRAMs 16f1 and 16r1 in which data is to be written; and renders inactive the active terminator units of the other DRAMs 16f2 and 16r2. Similarly, when data is to be written to the DRAM 16f2 or 16r2, the controller 11 renders inactive the active terminator unit of the DRAM 16f1 or 16r2; renders inactive the active terminator circuit 20 of the controller 11; and renders active the active terminator units of the DRAMs 16f1 and 16r1. This termination control operation is performed by the control unit 201 of the controller 11. Using this operation, data can also be exchanged while the impedance matching is being achieved.

In this embodiment, only one of the active terminator units of the DRAMs for the slot on the data reception side is set to the non-operating state during the writing operation, while the other active terminator units are set to the operating state. On the other hand, the active terminator circuit of the controller 11 on the data transmission side is set to the non-operating state. In this manner, impedance matching can be performed. And in this case, even when the active terminator unit of the DRAM on the data reception side is released, i.e., is rendered inactive, and when the active terminator units of the other DRAMs are set to the operating state, i.e., are rendered active, the impedance matching can be achieved and a reflection wave can be prevented.

Figure 9:
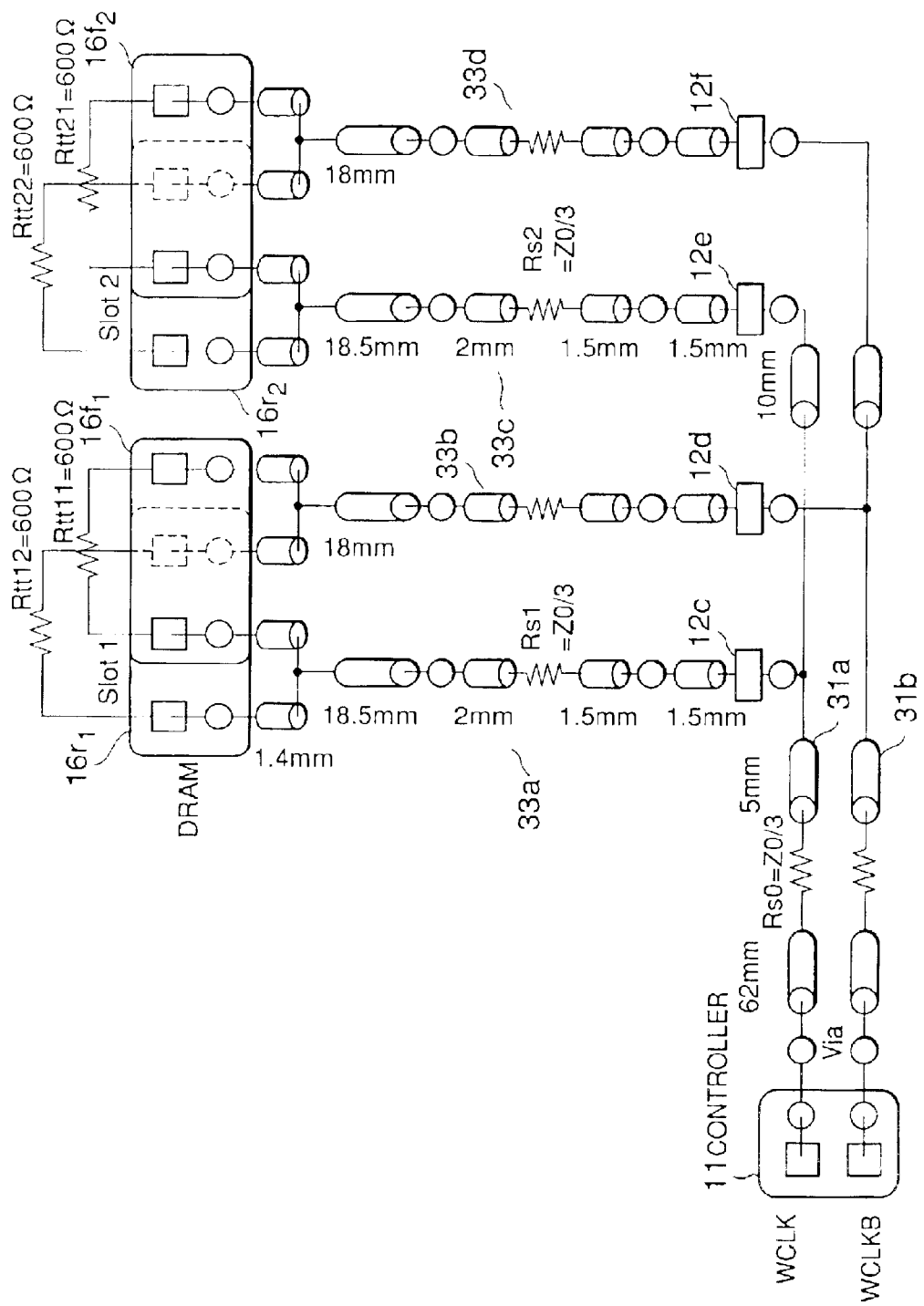
FIG. 9 is a diagram showing a clock bus topology that can be applied for the memory device in FIG. 8.

In FIG. 9 is shown a memory device that includes a clock bus structure that is appropriate for the data bus structure of the memory device shown in FIG. 8. As well as the data bus 13 in FIG. 8, the clock buses 31a and 31b of the memory device are joined together by star connection. That is, for the clock bus 31a, the impedance between the controller 11 and a resistor Rs0 is set equal to the synthesized impedance produced following the resistor Rs0. Therefore, the resistor Rs0 is inserted along the clock buses 31a and 31b, and resistors Rs1, Rs2, Rs3 and Rs4 are inserted at the stubs 33a, 33b, 33c and 33d. In this embodiment, the resistance set for the resistors Rs1, Rs2, Rs3 and Rs4 is Z0/3. It should be noted that when the Rs0 is not connected, the same effects can be obtained by adjusting the characteristic impedance along the wiring on the motherboard and the memory modules.

In the memory device in FIG. 9, differential coupling termination resistors Rtt1 and Rtt2 of 300Ω are connected as the terminal ends of the clock buses 31a and 31b to the DRAMs 16f1 and 16r1 and the DRAMs 16f2 and 16r2. Clock variances can be reduced by connecting these differential coupling termination resistors Rtt1 and Rtt2, and with this configuration, the reflection of a clock pulse and the deterioration of a waveform can be prevented. The terminal ends of the clock buses 31a and 31b nearest the controller 11 may also be terminated by the differential coupling termination resistor.

When the clock bus topology in this embodiment is used together with the data bus 13 in FIG. 8, the affects due to reflection can be reduced both for the data bus 13 and the clock buses.

The data bus has been mainly employed for the explanations given for the embodiments shown in FIGS. 1, 4 and 8. However, the same control operation can be performed for a command address bus having the same configuration. More specifically, to perform the termination process for a command address bus, a controller is connected to the command address bus that includes an active terminator unit for terminating the bus. The active terminator unit is rendered inactive or active when a command address is to be transmitted to a memory unit.

As is described above, according to the present invention, provided is a memory device wherein the controller and multiple memory modules are mounted on a motherboard, and multiple memory units are provided for each of the memory modules; wherein the controller and the memory units are connected by a data bus and/or clock buses; and wherein a reflection between the controller and the memory units and the distortion of a waveform can be suppressed.

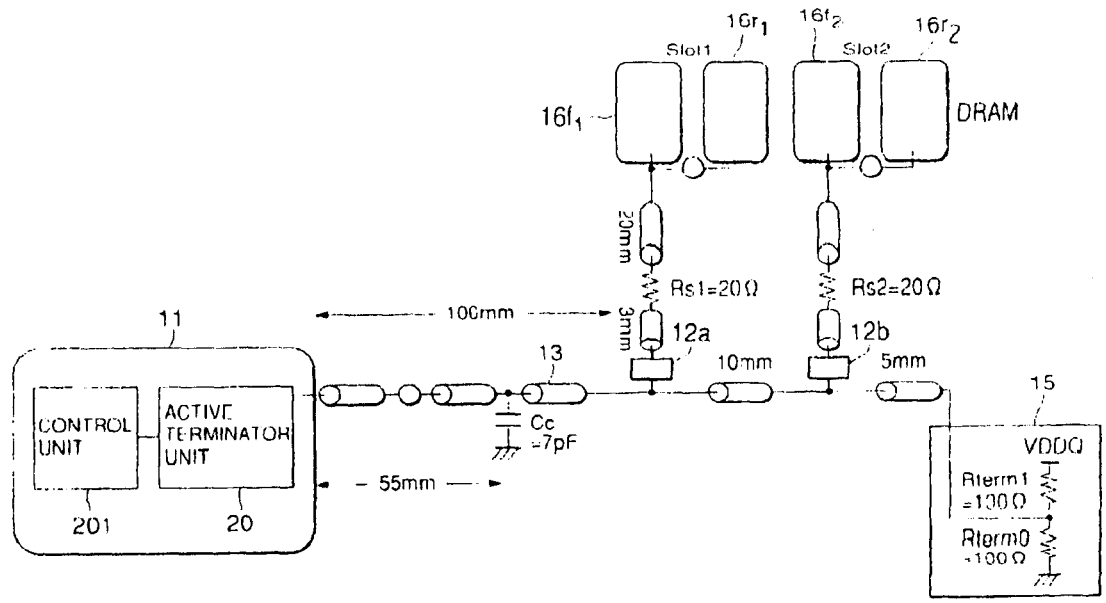

What is claimed is:

1. A memory device comprising:
   multiple memory units electrically connected to a bus; and
   a controller, connected to one end of said bus, for controlling a reading operation and a writing operation relative to said memory units,
   wherein the controller includes an active terminating circuit that is rendered active only during said reading operation.

2. A memory device according to claim 1, wherein said memory units are connected to said bus through stubs and connectors.

3. A memory device according to claim 2, wherein reflection prevention means, for preventing a reflected wave during said reading operation performed for said multiple memory units, is provided between said controller and the nearest one of said connectors that connects said multiple memory units to said bus and that is located nearest to said controller.

4. A memory device according to claim 3, wherein said reflection prevention means is formed by a circuit wherein a characteristic impedance between said nearest connector and said controller is smaller than another characteristic impedance of a connection on each memory unit.

5. A memory device according to claim 4, wherein said circuit includes a capacitor connected between said nearest connector and said controller.

6. A memory device according to claim 5, wherein said circuit has a bus connection length adjusted to the characteristic impedance between the nearest connector and said controller.

7. A memory device according to claim 1, wherein the bus has one end connected to said controller and the other end connected to a terminator unit while the terminator unit has a pair of terminal resistors that are connected in series between a predetermined power terminal and a reference power terminal through a common point of connection; and wherein the other end of said bus is jointed to the common point of connection of both the terminal resistors.

8. A memory device according to claim 1, wherein said bus is either a data bus or a command bus.

9. A memory device according to claim 1, wherein said memory units are terminated by an active terminator unit.

10. A memory device according to claim 1, wherein said bus is shielded.

11. A memory device according to claim 1, wherein said memory units are DRAMs.

12. A memory device comprising:
    a clock controller for transmitting complementary clocks;
    a pair of clock buses, connected at the ends thereof to said clock controller to transmit said complementary clocks; and
    multiple memory units, electrically connected to said pair of clock buses,
    wherein the pair of clock buses have one ends connected to the clock controller and opposite ends connected to a terminal resistor so that the pair of the clock buses are terminated by differential coupling.

13. A memory device according to claim 12, wherein said memory units are connected through a pair of connectors to said pair of clock buses; and wherein a clock bus segment between said terminal resistor and said pair of connectors that are nearest to the terminal resistor has a satisfactory length so as to serve substantially as a distributed constant circuit.

14. A memory device according to claim 13, wherein the impedance for said clock bus segment having said length is defined substantially as a characteristic impedance for said distributed constant circuit.

15. A memory device according to claim 13, wherein a clock bus segment between said controller and a pair of connectors that are nearest to said controller is longer than a clock bus segment between the other connectors.

16. A memory device according to claim 15, wherein a capacitor for reflection prevention is connected at said clock bus segment for said pair of connectors nearest to said controller.

17. A memory device according to claim 12, further comprising:
    a data bus for connecting said multiple memory units through multiple connectors; and
    a data bus controller, connected to one end of said data bus, for carrying out data transmission with said memory units through said data bus.

18. A memory device according to claim 17, wherein said data bus controller has an active terminator unit that is rendered active when data is to be read from said memory units, and that is maintained inactive when data is to be written to said memory units.

19. A memory device according to claim 18, wherein a terminal resistor circuit is constituted by a pair of resistors connected in series to each other and is connected to the other end of said data bus opposite to the end connected to the bus controller; and wherein the other end of said data bus is connected to a common point of connection of the pair of registers to terminate the other end of said data bus.

20. A memory device according to claim 19, further comprising a capacitor connected between said data bus controller and a connector nearest to the data bus controller so as to reduce reflection.

21. A memory device comprising:
a clock controller for transmitting complementary clocks;
a pair of clock buses, connected at the ends thereof to said clock controller to transmit said complementary clocks; and
multiple memory units, electrically connected to said pair of clock buses,
wherein each of said memory units includes a differential coupling termination circuit for terminating said pair of clock buses.

22. A memory device according to claim 21, wherein a differential coupling termination circuit is incorporated in each of said memory units.

23. A memory device according to claim 21, wherein said differential coupling terminating circuit is externally attached to each of said memory units.

24. A memory device according to claim 21, wherein said pair of clock buses have branches connected to said memory units, and wherein said differential coupling termination circuit is connected between said branches of said clock buses of each of said memory units.

25. A memory device comprising:
a clock controller for transmitting complementary clocks;
a pair of clock buses, connected at the ends thereof to said clock controller to transmit said complementary clocks; and
multiple memory units, electrically connected to said pair of clock buses,
wherein each of said memory units includes an active terminator unit for terminating said pair of clock buses.

26. A memory device according to claim 21, further comprising:
a data bus controller for performing data writing and reading relative to said multiple memory units; and
a data bus for connecting said data bus controller and said memory units.

27. A memory device according to claim 26, wherein said data bus controller has an active terminator unit that is rendered active when data is to be read from said memory units, and that is maintained inactive when data is to be written to said memory units.

28. A memory device according to claim 27, wherein each of said memory units includes an active terminator unit that is rendered inactive for data reading, and is rendered active for data writing, and wherein said data bus is terminated by said active terminator unit.

29. A memory device according to claim 27, wherein multiple slots, along a bus, for which memory units are provided; wherein said memory units include active terminator units that are rendered inactive for data reading; wherein an active terminator unit, which is included in a memory unit in a slot from which data is to be read, is rendered active while active terminator units for all other memory units are rendered inactive; and wherein said active terminator unit terminates said data bus.

30. A memory device comprising:
multiple memory units, electrically connected to a bus while being branched through connectors and stubs thereof; and
a controller, electrically connected to one end of said bus, for controlling a reading operation and a writing operation relative to said memory units,
wherein said bus between said controller and said multiple memory units, connectors, resistors and stubs is connected so that a substantially equal impedance is obtained along said bus relative to said controller and said memory units.

31. A memory device according to claim 30, wherein said controller and said multiple memory units are joined together along said bus by star connection such that n lines of the same characteristic impedance ZO are connected at branching points respectively through resistors baying a resistance of ZO/n, where n is a positive integer.

32. A memory device according to claim 30, wherein said bus is either a data bus or a command address bus.

33. device according to claim 30, wherein the controller and the memory units each have an active terminator unit to terminate said bus.

34. A memory device according to claim 30, wherein said controller and said memory units are connected through a pair of clock buses for providing complementary clocks.

35. A memory device according to claims 30, wherein said controller and said memory units are connected through a clock bus.

36. A memory device according to claim 30, wherein said bus is a clock bus.

37. A memory device according to claim 35, wherein said controller and said memory units are joined together through said pair of clock buses to form star connection.

38. A memory device according to claim 35, wherein said clock bus is terminated a terminating resistor connected on the memory unit side.

39. A memory device comprising:
a clock controller for transmitting complementary clocks;
a pair of clock buses, connected at the ends thereof to said clock controller to transmit said complementary clocks; and
multiple memory units, electrically connected to said pair of clock buses,
wherein the configuration of said clock bus is as described in claim 30.

40. A memory device according to claim 39, wherein said controller and said multiple memory units are joined together by said star connection through said pair of clock buses.

41. A memory device according to claim 39, wherein each of said memory units includes a differential coupling termination circuit for terminating said pair of clock buses.

42. A memory device according to claim 12, further comprising:
a command address bus for connecting said memory units to multiple connectors; and
a bus controller, connected to one end of said command address bus, for carrying out data transmission with said memory units through said command address bus.

43. A memory device according to claim 42, wherein said bus controller includes an active terminator unit that is rendered active when data is to be received from said memory units, and that is maintained inactive when command address data is to be sent to said memory units.

44. A memory device comprising:

multiple memory units electrically connected to a command address bus; and a bus controller, connected to one end of said command address bus to control a reading operation and a writing operation relative to said memory units, wherein said bus controller includes an active terminator unit and a controller for controlling said active terminator unit, wherein each of said memory units also includes an active terminator unit for terminating said command address bus, and wherein, when data is to be received from said memory units that are mounted in memory modules connected to connectors, said controller renders inactive only the active terminator unit of the memory unit from which data is to be read, and renders active the active terminator units of the other memory units and said bus controller.

45. A memory device comprising:

multiple memory units electrically connected to a command address bus; and a bus controller connected to one end of said command address bus to control a reading operation and a writing operation relative to said memory units, wherein said bus controller includes an active terminator unit and a controller for controlling said active terminator unit wherein each of said memory units also includes an active terminator unit for terminating said command address bus, and wherein, when command address data is to be written in said memory units, said controller renders said active terminator unit of said data bus controller inactive and renders said active terminator units of said memory units active.

46. A memory device comprising:

multiple memory units electrically connected to a command address bus; and a bus controller, connected to one end of said command address bus to control a reading operation and a writing operation relative to said memory units.

wherein said bus controller includes an active terminator unit and a controller for controlling said active terminator unit, wherein each of said memory units also includes an active terminator unit for terminating said command address bus, wherein there are multiple slots for which memory units are provided, and wherein, when command address data is to be transmitted to the memory unit in a specific slot, said controller renders inactive said active terminator unit of said data bus controller, and also renders inactive the active terminator unit of said memory unit in said specific slot, with the active terminator units of the other memory units kept active.

47. A memory device comprising:

multiple memory units electrically connected to a command address bus; and a bus controller, connected to one end of said command address bus to control a reading operation and a writing operation relative to said memory units, wherein said bus controller includes an active terminator unit and a controller for controlling said active terminator unit, wherein each of said memory units also includes an active terminator unit for terminating said command address bus, wherein there are multiple slots for which memory units are provided, and wherein, when command address data is to be transmitted to a memory unit in a specific slot, said controller renders inactive said active terminator unit of said data bus controller, and also renders inactive an active terminator unit of a command address register in said specific slot, while rendering the active terminator units of the other command address registers.

* * * * *

UNITED STATES PATENT AND TRADEMARK OFFICE
CERTIFICATE OF CORRECTION

PATENT NO.      : 6,970,369 B2  
APPLICATION NO. : 10/234261  
DATED           : November 27, 2005  
INVENTOR(S)     : Funaba et al.

It is certified that error appears in the above-identified patent and that said Letters Patent is hereby corrected as shown below:

Title Page, Item (56) References should include    4,628,512   12/1986   Loo   371/68.

Claim 31, Col. 20, line 20, "impedance ZO are" should be --impedance Z0 are--.

Claim 31, Col. 20, line 21, "resistors baying a" should be --resistors having a--.

Claim 31, Col. 20, line 22, "of ZO/n," should be --Z0/n--.

Claim 33, Col. 20, line 25, "device" should be --A memory device--.

Claim 48 should be added: --48. A memory device according to claim 22, wherein said differential coupling termination circuit is an active terminator unit that includes a MOS transistor and a resistor respectively connected to the source and the drain of said MOS transistor, and that renders said MOS transistor ON during an active state, and renders said MOS transistor OFF during an inactive state.--.

Signed and Sealed this

Twenty-third Day of November, 2010

David J. Kappos  
*Director of the United States Patent and Trademark Office*

UNITED STATES PATENT AND TRADEMARK OFFICE
CERTIFICATE OF CORRECTION

PATENT NO. : 6,970,369 B2
APPLICATION NO. : 10/234261
DATED : November 27, 2005
INVENTOR(S) : Funaba et al.

It is certified that error appears in the above-identified patent and that said Letters Patent is hereby corrected as shown below:

Delete the title page and substitute therefore the attached title page consisting of the corrected number of claims.

Title Page, Item (56) References should include    4,628,512   12/1986   Loo   371/68.

Claim 31, Col. 20, line 20, "impedance ZO are" should be --impedance Z0 are--.

Claim 31, Col. 20, line 21, "resistors baying a" should be --resistors having a--.

Claim 31, Col. 20, line 22, "of ZO/n," should be --Z0/n--.

Claim 33, Col. 20, line 25, "device" should be --A memory device--.

Claim 48, Col. 22, line 43, should be added: --48. A memory device according to claim 22, wherein said differential coupling termination circuit is an active terminator unit that includes a MOS transistor and a resistor respectively connected to the source and the drain of said MOS transistor, and that renders said MOS transistor ON during an active state, and renders said MOS transistor OFF during an inactive state.--.

This certificate supersedes the Certificate of Correction issued November 23, 2010.

Signed and Sealed this

Fourteenth Day of December, 2010

David J. Kappos
*Director of the United States Patent and Trademark Office*

(12) United States Patent
Funaba et al.

(10) Patent No.: US 6,970,369 B2
(45) Date of Patent: Nov. 29, 2005

(54) MEMORY DEVICE

(75) Inventors: Seiji Funaba, Tokyo (JP); Yoji Nishio, Tokyo (JP)

(73) Assignee: Elpida Memory, Inc. (JP)

(*) Notice: Subject to any disclaimer, the term of this patent is extended or adjusted under 35 U.S.C. 154(b) by 195 days.

(21) Appl. No.: 10/234,261

(22) Filed: Sep. 4, 2002

(65) Prior Publication Data

US 2003/0043683 A1 Mar. 6, 2003

(30) Foreign Application Priority Data

Sep. 6, 2001 (JP) ............... 2001-270518

(51) Int. Cl.⁷ ............................... D11C 5/06
(52) U.S. Cl. ............... 365/63; 365/230.03; 365/233
(58) Field of Search .................. 365/63, 230.03, 365/233

(56) References Cited

U.S. PATENT DOCUMENTS

| | | | | |
|---|---|---|---|---|
| 6,125,419 A | * | 9/2000 | Umemura et al. | 710/110 |
| 6,308,232 B1 | * | 10/2001 | Gasbarro | 710/100 |
| 6,370,053 B2 | * | 4/2002 | Chang et al. | 365/51 |
| 6,538,951 B1 | * | 3/2003 | Janzen et al. | 365/230.03 |
| 6,690,612 B2 | * | 2/2004 | Gall et al. | 365/226 |

FOREIGN PATENT DOCUMENTS

| JP | 4-50933 | 4/1992 | H03K/10/0175 |
|---|---|---|---|
| JP | 07-135513 | 5/1995 | H04L/25/02 |
| JP | 07-182078 | 7/1995 | G06F/3/00 |
| JP | 07-240680 | 9/1995 | H03K/19/0175 |
| JP | 11-083545 | 3/1999 | G06F/3/00 |
| JP | 11-317489 | 11/1999 | H01L/25/00 |
| JP | 11-353228 | 12/1999 | G06F/12/06 |
| JP | 2001-257018 | 9/2001 | H01R/12/16 |
| JP | 2002-032164 | 1/2002 | G06F/3/00 |
| JP | 2002-271108 | 9/2002 | H01P/1/212 |
| JP | 2003-068082 | 3/2003 | G11C/11/409 |

* cited by examiner

*Primary Examiner*—Son T. Dinh
(74) *Attorney, Agent, or Firm*—Hayes Soloway P.C.

(57) ABSTRACT

In a memory device having a controller and multiple memory modules both of which are mounted together on a motherboard, a high-speed operation is executed by suppressing waveform distortion caused by signal reflection. Since signal reflection occurs when a controller performs the writing/reading of data relative to memory units on memory modules, active terminator units are included in the controller and the memory units. These active terminator units are provided for a data bus and/or a clock bus in order to terminate these buses in memory units. The active terminator units provided for the controller and the memory units may be put into an inactive state when data is to be received.

48 Claims, 9 Drawing Sheets